(12) United States Patent
Buijsse

(10) Patent No.: US 8,658,974 B2
(45) Date of Patent: Feb. 25, 2014

(54) ENVIRONMENTAL CELL FOR A PARTICLE-OPTICAL APPARATUS

(75) Inventor: Bart Buijsse, Eindhoven (NL)

(73) Assignee: FEI Company, Hillsboro, OR (US)

( * ) Notice: Subject to any disclaimer, the term of this patent is extended or adjusted under 35 U.S.C. 154(b) by 103 days.

(21) Appl. No.: 13/328,745

(22) Filed: Dec. 16, 2011

(65) Prior Publication Data

US 2012/0091338 A1 Apr. 19, 2012

Related U.S. Application Data

(63) Continuation of application No. 12/413,463, filed on Mar. 27, 2009, now Pat. No. 8,093,558.

(30) Foreign Application Priority Data

Mar. 28, 2008 (EP) .................................. 08153482

(51) Int. Cl.
*G01N 5/00* (2006.01)

(52) U.S. Cl.
USPC ............ 250/311; 250/306; 250/307; 250/310

(58) Field of Classification Search
USPC ........ 250/306, 307, 310, 311, 440.11–442.11
See application file for complete search history.

(56) References Cited

U.S. PATENT DOCUMENTS

| | | | |
|---|---|---|---|
| 4,785,182 A | 11/1988 | Mancuso et al. | |
| 4,823,006 A | 4/1989 | Danilatos et al. | |
| 4,880,976 A | 11/1989 | Mancuso et al. | |
| 4,882,486 A | 11/1989 | Kruit | |
| 4,897,545 A | 1/1990 | Danilatos | |
| 4,992,662 A | 2/1991 | Danilatos | |
| 5,250,808 A | 10/1993 | Danilatos et al. | |
| 5,578,822 A | 11/1996 | van der Mast et al. | |
| 5,898,261 A * | 4/1999 | Barker | 313/420 |
| 5,945,672 A | 8/1999 | Knowles et al. | |
| 6,365,896 B1 * | 4/2002 | van der Mast | 250/310 |
| 6,972,412 B2 | 12/2005 | Scholtz et al. | |
| 7,035,379 B2 | 4/2006 | Turner et al. | |
| 7,045,791 B2 * | 5/2006 | Benas-Sayag et al. ... 250/396 R |

(Continued)

FOREIGN PATENT DOCUMENTS

| EP | 0676772 | 10/1995 |
|---|---|---|
| EP | 1724809 | 11/2006 |

(Continued)

OTHER PUBLICATIONS

Ervin, Matthew H., "A Simple Low-Vacuum Environmental Cell," Microscopy and Microanalysis, 2003, pp. 18-28, vol. 9.

(Continued)

*Primary Examiner* — Michael Maskell
(74) *Attorney, Agent, or Firm* — Scheinberg & Associates, PC; Michael O. Scheinberg

(57) ABSTRACT

The invention relates to an environmental cell for use in e.g. an electron microscope. The environmental cell shows an aperture (15) for passing the beam produced by the electron microscope to a sample (6) placed inside the environmental cell. The environmental cell according to the invention is characterized in that a part of the environmental cell (14) is transparent to secondary radiation such as back-scattered electrons or X-rays. This enables the detection of this radiation by a detector placed outside the environmental cell and thus a much simpler construction of the cell.

27 Claims, 5 Drawing Sheets

(56) References Cited

U.S. PATENT DOCUMENTS

| | | | |
|---|---|---|---|
| 7,233,647 B2 | 6/2007 | Turner et al. | |
| 7,253,418 B2 * | 8/2007 | Moses et al. | 250/440.11 |
| 7,476,871 B2 * | 1/2009 | Chao et al. | 250/440.11 |
| 7,541,580 B2 | 6/2009 | Knowles et al. | |
| 7,544,954 B2 * | 6/2009 | Chao et al. | 250/441.11 |
| 7,807,979 B2 * | 10/2010 | Liu et al. | 250/440.11 |
| 2004/0217297 A1 * | 11/2004 | Moses et al. | 250/441.11 |
| 2006/0249688 A1 * | 11/2006 | Chao et al. | 250/441.11 |
| 2008/0179518 A1 * | 7/2008 | Creemer et al. | 250/311 |
| 2009/0045349 A1 | 2/2009 | Sprinzak et al. | |
| 2010/0171037 A1 | 7/2010 | Bierhoff et al. | |
| 2010/0230590 A1 | 9/2010 | Bierhoff et al. | |
| 2011/0031394 A1 * | 2/2011 | Knowles et al. | 250/307 |
| 2011/0079710 A1 * | 4/2011 | Damiano et al. | 250/307 |

FOREIGN PATENT DOCUMENTS

| | | |
|---|---|---|
| JP | 50-26759 | 3/1975 |
| JP | 57095053 | 6/1982 |
| JP | 2003-308801 | 10/2003 |
| JP | 2007-292702 | 11/2007 |
| WO | 2004025682 | 3/2004 |
| WO | 2008098084 | 8/2008 |

OTHER PUBLICATIONS

Mathieu, C., "The Beam-Gas and Signal-Gas Interactions in the Variable Pressure Scanning Electron Microscope," Scanning Microscopy, 1999, pp. 23-41, vol. 13, No. 1.

Oho, Eisaku, et al., "Quality Improvement of Environmental Secondary Electron Detector Signal Using Helium Gas in Variable Pressure Scanning Electron Microscopy," Scanning, 2007, pp. 225-229, vol. 29.

Slowko, Witold, "Secondary Electron Detector with a Micro-Porous Plate for Environmental SEM," Vacuum Surface Engineering, Surface Instrumentation & Vacuum Technology, 2001, ggs 457-461, vol. 63.

Slowko, Witold, "Electron Signal Acquisition in HPSEM," Vacuum Surface Engineering, Surface Instrumentation & Vacuum Technology, 2003, pp. 157-162, vol. 70.

Chinese Office Action, Jan. 5, 2012, 15 pgs.

Chinese Office Action, Aug. 3, 2012, 13 pgs.

Xueli, Du, et al., 'Scanning Electron Microscope Analysis Technology,' May 31, 1986, 3 pgs, Chemical Industry Publishing House.

* cited by examiner

ENVIRONMENTAL CELL FOR A PARTICLE-OPTICAL APPARATUS

This application is a Continuation Application of U.S. patent application Ser. No. 12/413,463, filed Mar. 27, 2009, and is hereby incorporated by reference.

TECHNICAL FIELD OF THE INVENTION

The invention relates to a method for forming an image of a sample with a particle-optical apparatus, the method comprising:
  providing a particle-optical apparatus comprising a particle-optical column, said column equipped to produce a beam of particles along a particle-optical axis;
  providing an environmental cell showing an aperture facing the column, the aperture surrounding the particle-optical axis, said environmental cell equipped to be exposed to vacuum, said environmental cell showing an inner volume wherein a sample may be placed, said environmental cell equipped to withstand a pressure difference over the aperture, the material of the environmental cell substantially impervious to fluids;
  providing a sample in said environmental cell;
  providing a detector for the detection of secondary radiation emanating from the sample as a result of the beam of particles impinging on the sample;
  evacuating the area between the aperture and the particle-optical column;
  directing the beam of particles through the aperture to the sample; and
  detecting secondary radiation other than visible light emanating from the sample in response to the irradiation of the sample with the beam of particles.

The invention further relates to the environmental cell used in said method.

BACKGROUND OF THE INVENTION

Such an environmental cell and the method for using such a cell in a Scanning Electron Microscope (SEM) are known from "A simple low-vacuum environmental cell", M. E. Ervin, Microsc. Microanal. 9, 18-28, 2003.

In a SEM a finely focused beam of primary electrons with a fixed energy of e.g. between 1 keV and 30 keV is scanned over the surface of a sample. As a result of the primary electrons impinging on the sample, secondary radiation is emitted by the sample. Said secondary radiation comprises light, X-rays, secondary electrons and back-scattered electrons. The difference between secondary electrons and back-scattered electrons is the energy with which they escape from the sample: while secondary electrons have an energy of up to approximately 10 eV, back-scattered electrons retain a large portion of the energy with which the primary electrons impinge on the sample. By detecting part of the secondary radiation, e.g. the back-scattered electrons and/or the secondary electrons, an image of the sample can be constructed.

To direct the electrons to the sample implies that most of the electrons may not interact with gas atoms or molecules, as this would scatter these electrons away from the beam of primary electrons and would cause these scattered electrons to impinge elsewhere on the sample. Therefore the sample is placed in an evacuated volume with a pressure of typically less than $10^{-3}$ mbar.

A problem arising from the irradiation of the sample with a beam of electrons is that the sample may become charged. Said charging may influence the position where the beam impinges on the sample, as well as the detection of the secondary electrons and back-scattered electrons. It is known that said charging can be eliminated, or at least strongly reduced, by placing the sample in a volume with a pressure between 0.1 and 10 mbar: some of the atoms or molecules in the gas will become ionized by interaction with primary of secondary radiation, and these ionized atoms or molecules will drift to the charged parts of the sample and neutralize said charge. However, a draw-back of this is that sufficient ionization must take place and therefore the electrons causing this ionization are scattered out of the primary beam, resulting in other parts of the sample being irradiated as well. As described by C. Mathieu, "The beam-gas and signal-gas interactions in the variable pressure scanning electron microscope", Scanning Microscopy Vol. 13, No. 1, pages 23-41, this so-named 'skirting effect' results in a reduced signal-to-noise ratio when detecting e.g. the back-scattered electrons.

The known environmental cell comprises a small volume in which a sample is placed. The environmental cell is placed in the SEM. The small volume is surrounded by a vacuum wall which shows a diaphragm facing the SEM column. The diaphragm shows an aperture through which the electron beam may enter the small volume and thereby irradiate the sample. The aperture is sufficiently small to limit the amount of gas escaping from the small volume to an amount that is acceptable to the SEM's vacuum system. Hereby it is possible to have a pressure of e.g. between 0.1 and 10 mbar at the inside of the environmental cell and a much lower pressure between the aperture and the SEM column Charging of the sample is thus avoided or at least greatly reduced while the length over which the primary beam interacts with the gas is limited to the distance between aperture and sample. The volume being small, this distance is equally small, resulting in a small number of electrons scattered by the gas.

A problem arises when detecting the secondary radiation using such an environmental cell: only radiation passing through the aperture can be detected outside the environmental cell. Therefore the known environmental cell is constructed such that the diaphragm is electrically isolated from the rest of the environmental cell. By applying a voltage difference between the rest of the environmental cell (and the sample placed on said rest of the environmental cell) and the diaphragm an electric field is formed between the sample and the diaphragm. As a result electrons coming from the sample form a cascade of ionizations, the so-named gas-cascade. The resultant gas-cascade current is collected by the diaphragm and measured with a sensitive electrometer connected to said diaphragm.

A disadvantage mentioned by Ervin is that the gas-cascade current is quite small (typically 5 nA) and to measure such a small current, the time constant requires that a slow scan rate be used. This implies that focusing the sample and obtaining an image of the sample take much longer than when imaging at e.g. video rate.

Another disadvantage is that by electrically insulating the diaphragm and electrically connecting it with an electrometer, the environmental cell becomes complicated.

Still another disadvantage is that the electrical connection between the diaphragm and the electrometer is likely to pick up interference, resulting in a deterioration of the image and further adding to design constrains.

Yet another disadvantage is that the multiplication of the gas-cascade not only depends on the electric field between sample and diaphragm, but also strongly depends on the pressure of the gas and the composition of the gas: if the pressure is too high, the electrons will not pick-up sufficient energy between collisions to cause ionization, if the pressure is too low an insufficient number of collisions occur.

Aim of the Invention

There is a need for an environmental cell of simpler design and improved performance.

SUMMARY OF THE INVENTION

To that end the method is characterized in that
at least part of the material of the environmental cell is transparent to the secondary radiation other than visible light, and
the detector is positioned outside the environmental cell, the detector arranged to detect the secondary radiation other than visible light passing through the part of the environmental cell transparent to the secondary radiation.

The construction of the environmental cell, that need not have a build-in detector, can be much simpler than when the detector is part of the environmental cell. The opening angle under which secondary radiation can be detected can be much larger than when detecting only radiation emerging through the aperture.

By detecting the secondary radiation passing through the material of the environmental cell, the detector can be mounted outside the environmental cell, and therefore the detector can be e.g. a standard BSE detector which is commonly present in such a particle-optical apparatus.

It is noted that any scattering of the secondary radiation by the material of the environmental cell does not deteriorate the resolution of the image, as the resolution is determined by the diameter of the primary beam where it impinges on the sample and the secondary radiation detected is assumed to emerge from the position where the beam impinges.

It is noted that using the environmental cell described in U.S. Pat. No. 7,253,418 also secondary radiation passing through a membrane is detected. The membrane does however not show an aperture for passing the primary beam of particles, and the primary beam therefore has to pass through the membrane, resulting in scattering of the primary beam. Therefore only sample material placed against, or very close to, the membrane can be imaged with high resolution and/or high signal-to-noise ratio.

It is further noted that U.S. Pat. No. 7,045,791 describes a SEM where light is guided to and reflected from a sample. This light passes though a transparent glass window, said window enclosing an aperture through which the primary beam passes to the sample. Said glass window is however only transparent to visible light, and not to other types of secondary radiation, such as secondary electrons.

It is mentioned that the pressure at the sample may be large enough to prevent charging of the sample, e.g. 1 mbar, but that higher pressures, e.g. a pressure in which liquid water may be present, may be used. For liquid water to be present a—strongly temperature dependent—pressure in excess of 4 mbar is needed.

In an embodiment of the method according to the invention the part of the environmental cell transparent to the secondary radiation faces the column.

Detectors in SEM's are typically placed on the side of the sample facing the column By making a part of the environmental cell facing the sample transparent to the secondary radiation, these detectors can detect the secondary radiation.

In another embodiment the secondary radiation comprises electrons and/or X-rays and at least part of the material of the environmental cell is transparent to said electrons and/or X-rays and the detector is equipped to detect said electrons and/or X-rays.

The detection of electrons, either secondary electrons or back-scattered electrons, and X-rays is well known in electron microscopy.

In yet another embodiment of the method according to the invention the beam of particles is a focused beam of particles that is scanned over the sample.

This embodiment describes e.g. a SEM or a Focused Ion Beam apparatus (FIB), where a finely focused beam of energetic electrons or ions is scanned over the sample. This may give a resolution of better than 1 nm. The use of a FIB is, as known to the person skilled in the art, especially advantageous when there is a need to modify the sample, e.g. by milling or etching of the sample or by depositing material onto the sample.

It is noted that the gas inside the environmental cell may enhance said etching, milling or deposition.

In yet another embodiment of the method according to the invention the material of the environmental cell transparent to the secondary radiation other than visible light comprises a foil strengthened with a carrier, said foil transparent to the secondary radiation.

As the transparent part of the environmental cell needs to pass e.g. electrons, it needs to be very thin. Any pressure difference over the transparent part of the environmental cell occurring during the pump-down, imaging of the sample, or venting, may rupture the transparent part. To strengthen the transparent part it may be supported by a carrier, e.g. in the form of a mesh. The carrier may be a synthetic material, but may also be a metal gauze, such as the copper grids often used in electron microscopy.

In yet another embodiment of the method according to the invention the environmental cell comprises a second aperture arranged round the particle-optical axis at the side of the environmental cell opposite to the column, as a result of which particles produced by the column can subsequently pass through the aperture facing the column, the sample and the second aperture.

This method can be used in e.g. a Transmission Electron Microscope (TEM), in which secondary radiation is detected as well as primary particles transmitted through the sample. Detecting such transmitted particles is known to the person skilled in the art of TEM and is especially advantageous when observing thin samples, such as samples obtained by forming thin slices from e.g. biological tissue.

It is remarked that, when inspecting such thin samples, it may be advantageous to detect radiation coming from both sides of the thin sample, thereby increasing the amount of radiation detected. This can be done by forming each area surrounding the apertures from material transparent to the secondary radiation.

In yet another embodiment of the method according to the invention the material of the environmental cell transparent to the secondary radiation other than visible light comprises materials from the group of polyamide, polymide, polyamide-imide, polyethylene, polypyrrole, collodion, PARLODION®, KAPTON®, FORMVAR®, VINYLEC®, BUTVAR®, PIOLOFORM®, $SiO_2$, SiO, SiN and C.

Thin foils comprising these materials are known to be transparent to electrons and X-rays.

It is mentioned that the use of a carbon layer, either as a foil or as a layer on a foil, results in an electrically conductive foil, thereby eliminating charging of the material of the foil.

In yet another embodiment of the method according to the invention at least part of the environmental cell shows a transparency of at least 50% for electrons with an energy of 5 keV, more preferably a transparency of at least 50% for electrons with an energy of 1 keV.

Electron detectors for detecting electrons with an energy of 1 keV or less are known to the person skilled in the art. Such detectors may e.g. comprise a photodiode. By using a foil that passes such electrons, said electrons can be detected with such an electron detector.

In yet another embodiment of the method according to the invention a gas is admitted to the environmental cell while directing the beam of particles to the sample, a gas is admitted to the vacuum enclosure.

By admitting a gas into the vacuum enclosure where the sample resides, a higher gas pressure can be maintained inside the vacuum enclosure than at the side of the transparent part of the environmental cell, said higher gas pressure resulting in e.g. reduced charging, or e.g. in the presence of etch or precursor materials in the vicinity of the sample.

It is noted that the gas can be admitted via e.g. a tube or a hose from a reservoir of gas. As an alternative a source of gas can be used to admit the gas, e.g. by evaporating a material inside the environmental cell. Such a source of gas can be placed inside the environmental cell, or can be connected to the environmental cell via a hose or tube.

In a further embodiment of the method according to the invention the gas causes, when irradiated by a beam of electrons or ions, enhanced etching of the sample or deposition of material onto the sample.

The use of etchant gasses, such as water, XeF2, etc. is well known from use in a FIB. Also so-named precursor gasses, that dissociate when irradiated with electrons or ions and form a deposit of material on the sample, are known to the person skilled in the art.

In another embodiment of the method according to the invention the gas comprises helium.

The use of helium as a gas to improve the image quality of a SEM image is known from e.g. "Quality Improvement of Environmental Secondary Electron Detector Signal Using Helium Gas in Variable Pressure Scanning Electron Microscopy", E. Oho et al., Scanning, Volume 29, Issue 5, Pages 225-229, showing that the scattering in helium is much less than e.g. in nitrogen or air. The earlier mentioned skirting effect is therefore less pronounced.

In an aspect of the invention an environmental cell for use in a particle-optical apparatus, the environmental cell comprising:
  an vacuum enclosure showing an aperture for passing the beam of particles, the material of the vacuum enclosure impervious to fluid and equipped to withstand a pressure difference; and
  is characterized in that
  at least a part of the material of the vacuum enclosure is transparent to secondary radiation other than light.

By forming at least a part of the material of the vacuum enclosure from a transparent material, secondary radiation such as electrons or X-rays emanating from the sample can be detected through said material. The opening angle under which such radiation can be detected can be much larger than when only radiation emerging through the aperture is detected. The construction of the environmental cell, that need not have a build-in detector, can be much simpler than when the detector is part of the environmental cell.

By forming the aperture sufficiently small, the pressure inside the environmental cell can be high enough to avoid charging while the gas leakage through the aperture is sufficiently small to avoid scattering of particles between the particle-optical column and the aperture.

The maximum size of the aperture is a function of the gas pressure necessary inside the environmental cell and the pumping capacity of the pumps evacuating the volume between aperture and the particle-optical column forming part of the particle-optical apparatus.

As the field of view is governed by the size of the aperture, too small a diameter of the aperture should be avoided.

In an embodiment of the environmental cell according to the invention the part of the vacuum enclosure transparent to secondary radiation is transparent to electrons and/or X-rays.

The detection of electrons, either secondary electrons or back-scattered electrons, and/or X-rays is well known in electron microscopy.

In a further embodiment of the environmental cell according to the invention the part of the vacuum enclosure transparent to the secondary radiation shows a transparency of at least 50% for electrons with an energy of 5 keV, more preferably for electrons with an energy of 1 keV.

Electron detectors for detecting electrons with an energy of 1 keV or less are known to the person skilled in the art. Such detectors may e.g. comprise a photodiode.

In another embodiment of the environmental cell according to the invention the environmental cell is equipped with means to admit gas to the vacuum enclosure.

By admitting gas to the vacuum enclosure the pressure inside the cell can be adjusted so as to eliminate charging. By admission of etchant gasses (to etch material from the sample) or precursor gasses (to deposit material on the sample) the sample may be modified. Furthermore it is possible to admit e.g. water vapour to such a pressure that an equilibrium with water from the sample occurs, thereby avoiding dehydration of the sample.

The means to admit gas may take the form of a (rigid or flexible) tubing or hose to a gas reservoir, or to the environment. The amount of admitted gas may be regulated by a so-named leak-valve.

Another possibility is e.g. to use a reservoir of liquid (or a material comprising the liquid) to form the gas by evaporation. This reservoir may be situated outside the environmental cell, but may be placed inside the environmental cell. By varying the temperature of such a reservoir the amount of evaporation can be varied, resulting in an adjustable equilibrium pressure. This may be a preferred method for obtaining water vapour as a gas in the environmental cell.

As an alternative e.g. a solid or liquid decomposing as a result of e.g. heating can be used.

Also e.g. mixing of two (or more) materials that, due to a chemical reaction, form a gas may be used.

It is noted that it is possible to heat material in the environmental cell so as to form a gas without any physical connection between the cell and an energy source: heating can take place by e.g. warming the environmental cell with light, or e.g. electro-magnetic radiation in the form of microwaves.

In another embodiment of the environmental cell according to the invention the environmental cell forms the specimen chamber of the SEM, at least part of the outside of the environmental cell equipped to be exposed to vacuum while another outside part of the environmental cell is kept at atmospheric pressure.

In some SEM's, such as the Phenom™ tabletop SEM of FEI Company, Hillsboro, USA, a cup is used as the vacuum chamber where the sample resides. A sample can then be placed inside the cup. The cup is then inserted into the SEM such that the open end of the cup faces the particle-optical column of the SEM. The outside closed end is exposed to air.

By evacuating the inside the cup and the column, the cup is pressed against the particle-optical apparatus.

Such a cup can be modified as an environmental cell by forming the open end as a diaphragm with an aperture, at least part of the diaphragm transparent to secondary radiation. The result is a cheap, easy to handle, environmental cell for such tabletop SEM's.

In yet another embodiment of the environmental cell according to the invention the diaphragm comprises material from the group of polyamide, polymide, polyamide-imide, polyethylene, polypyrrole, collodion, PARLODION®, KAPTON®, FORMVAR®, VINYLEC®, BUTVAR®, PIOLOFORM®, $SiO_2$, SiO, SiN and C.

Thin foils comprising these materials are known to be transparent to electrons and X-rays.

It is mentioned that the use of a carbon layer, either as a foil or as a layer on a foil, results in an electrically conductive foil, thereby eliminating charging of the material of the foil.

In yet another embodiment of the environmental cell according to the invention the transparent part of the environmental cell comprises a foil transparent to secondary radiation, said foil supported by a carrier.

As the transparent part of the vacuum enclosure needs to pass e.g. electrons, it needs to be very thin. Any pressure difference over the transparent part occurring during the pump-down, imaging of the sample, or venting, may rupture the diaphragm. To strengthen the foil it may be supported by a carrier, e.g. in the form of a mesh. The carrier may be a synthetic material, but may also be a metal gauze, such as the copper grids often used in electron microscopy In yet another embodiment of the environmental cell according to the invention the environmental cell further comprises a second aperture arranged such that particles passing through the other aperture and through the sample pass through the second aperture.

This method can be used in e.g. a Transmission Electron Microscope (TEM), in which secondary radiation is detected as well as primary particles transmitted through the sample. Detecting such transmitted particles is known to the person skilled in the art of TEM and is especially advantageous when observing thin samples, such as samples obtained by forming thin slices from e.g. biological tissue.

It is remarked that, when inspecting such thin samples, it may be advantageous to detect radiation coming from both sides of the thin sample, thereby increasing the amount of radiation detected. This can be done by forming each area surrounding the apertures from material transparent to the secondary radiation.

In yet another embodiment of the environmental cell according to the invention the environmental cell further comprises means for positioning the sample, as a result of which different parts of the sample may be irradiated by the particle-optical column By incorporating displacement means which can move the sample with respect to the aperture, it is possible to select different parts of the sample for inspection, so that a larger portion of the sample can be irradiated with the beam of particles.

The means for positioning the sample may take the form of an x-y table, or may e.g. be due to a deformation of the vacuum enclosure due to forces to the (flexible) vacuum enclosure, or it may include sliding parts of the environmental cell sliding over each other. The positioning may be done manually or motorized.

BRIEF DESCRIPTION OF THE DRAWINGS

The invention will be further elucidated on the basis of figures, in which identical reference numerals indicate corresponding elements. To this end.

DETAILED DESCRIPTION OF THE DRAWINGS

Figure 1:
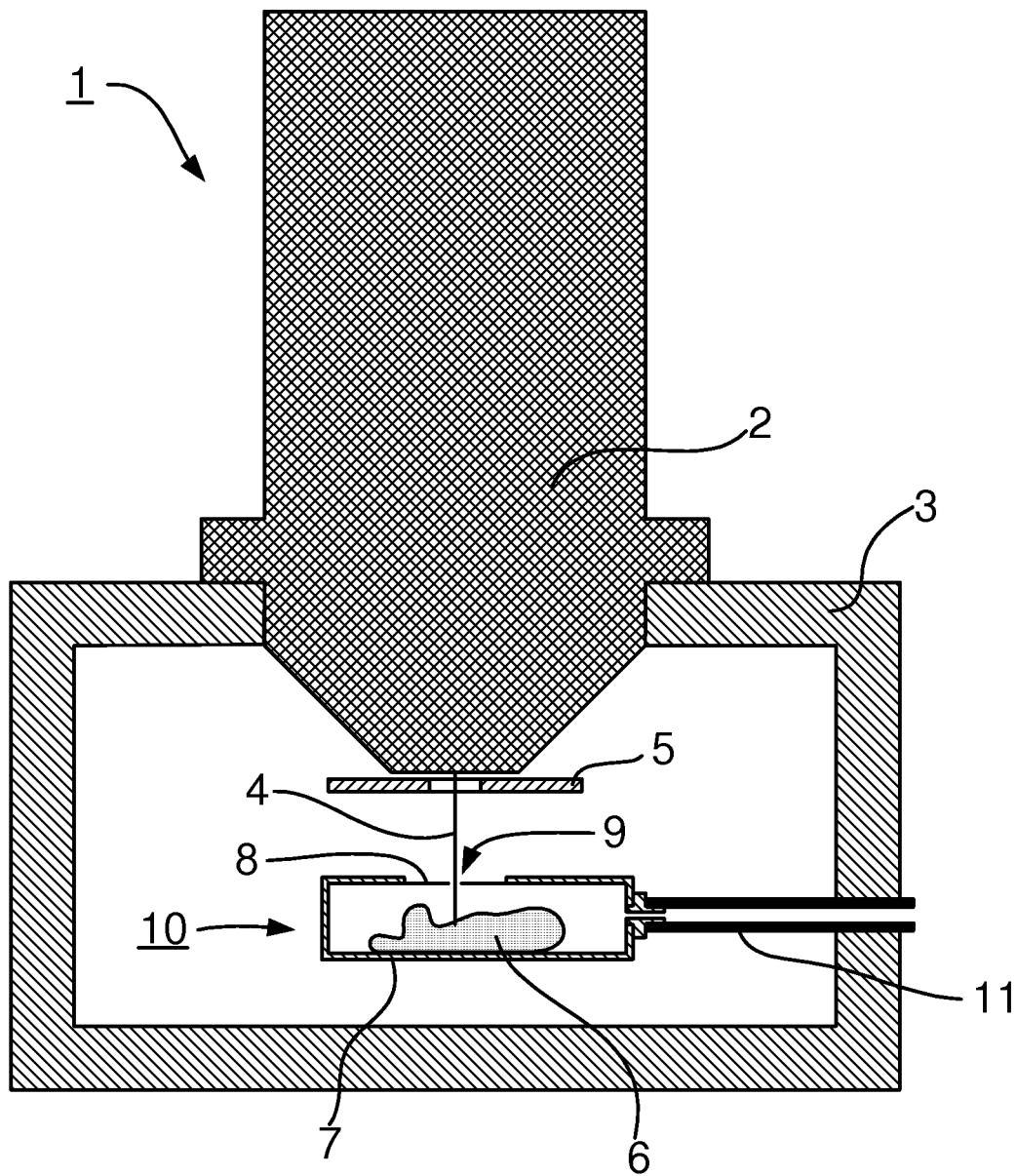
FIG. 1 schematically shows a particle-optical column with an environmental cell according to the invention.

FIG. 1 schematically shows a particle-optical apparatus 1 with an environmental cell 10 according to the invention.

The particle-optical apparatus 1 comprises a column 2 producing a beam of particles 4 along a particle-optical axis. Column 2 is mounted on a vacuum chamber 3, which can be evacuated with a vacuum pump (not shown), such as a rotary pump, an oil diffusion pump, a turbo-molecular pump, a sorption pump or an ion getter pump. The apparatus further comprises an electron detector 5 in the form of a photodiode with a central hole for passing the beam of particles. Other types of detectors, such as electron detectors of the Everhart-Thornley type or X-ray detectors, may be used together with or instead of said electron detector 5.

The beam of particles 4 impinges on the sample 6, located in the environmental cell 10. The environmental cell comprises a vacuum enclosure 7, showing an aperture 9. A part 8 of the material of the vacuum enclosure is transparent to e.g. back-scattered electrons, so that said back-scattered electrons emerging from the sample 6 may reach the detector 5 to be detected.

A hose 11 connects the interior of the environmental cell to atmospheric pressure. The pressure in the environmental cell may be regulated by the conductance of the tube balanced by the conductance of the aperture towards the evacuated volume in the vacuum chamber 3.

It is noted that hose 11 need not connect directly to the atmosphere, but may connect to atmosphere via a leak valve, thereby enabling adjustment of the pressure in the environmental cell. Also regulation of the pressure inside the environmental cell by offering another, adjustable conduction to an evacuated area may be used.

The hose may also connect to a volume with a much reduced pressure, said volume pumped by pumping means such as a membrane pump, a rotary pump, or such like.

It is remarked that the interior of the environmental cell need not be connected to atmosphere, but that e.g. inert gasses such as N2 or noble gasses may be admitted. A special case is the admittance of He, which scatters the beam less than other gasses, see "Quality Improvement of Environmental Secondary Electron Detector Signal Using Helium Gas in Variable Pressure Scanning Electron Microscopy", E. Oho et al., Scanning, Volume 29, Issue 5, Pages 225-229.

Alternatively an etchant gas such as water or $XeF_2$ may be admitted, or a precursor gas for depositing material on the sample may be used.

It is noted that e.g. a vacuum hose may be used to pump down the interior of the environmental cell to the required pressure. This may be the vacuum hose used to admit a gas to the environmental cell, but may also be a separate house, connecting the interior of the environmental cell to e.g. a vacuum pump of the apparatus, or to a dedicated pump such as a membrane pump or another type of pre-vacuum pump.

Figure 2A:
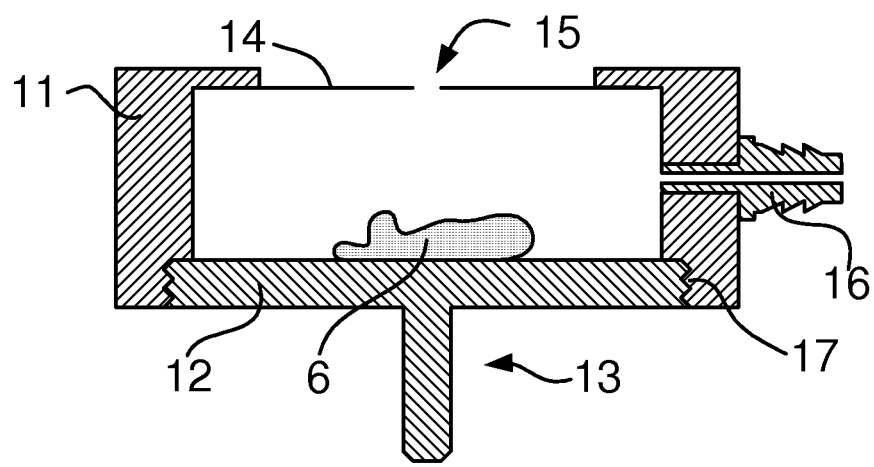
FIGS. 2A and 2B schematically show an embodiment of the environmental cell according to the invention.
Figure 2B:
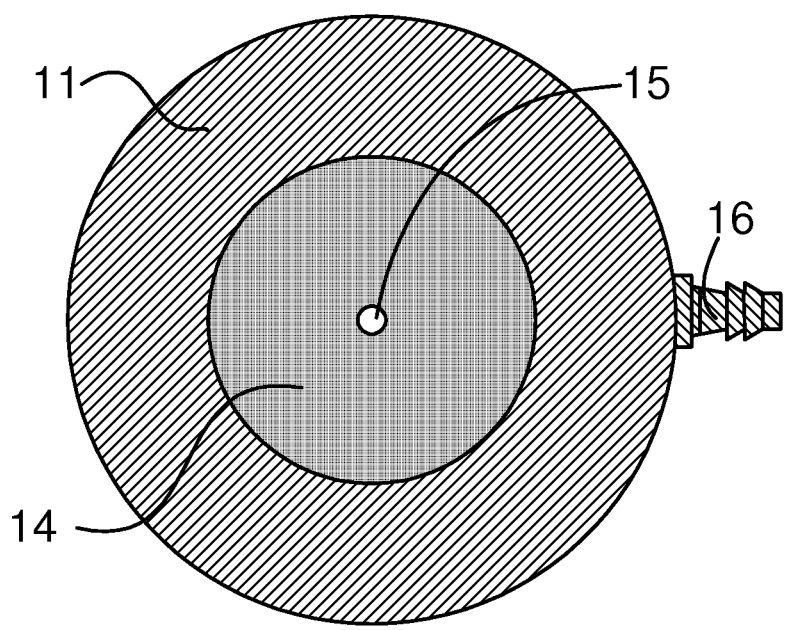

FIGS. 2A and 2B schematically show an embodiment of the environmental cell according to the invention.

FIG. 2A shows a sectional view of the environmental cell, while FIG. 2B shows a top view, that is: a view of the side of the environmental cell intended to face the column A vacuum enclosure is formed by base 12, cylindrical body 11 and foil 14. Base 12 shows a stub 13 making it compatible to a conventional stub sample holder of a SEM. Hereby the environmental cell can be mounted in a conventional SEM. Foil 14 is transparent to the secondary radiation and shows a central hole 15 for passing the primary beam of particles. A hose nipple 16 enables a hose to be attached to the environmental cell so as to admit a gas to the interior of the environmental cell.

Cylindrical body 11 is attached to base 12 by screw thread 17. By unscrewing the body 11 and the base 12 the base is exposed, and a sample 6 can be attached to the base. The cell is then closed by screwing the cylindrical body 11 on base 12.

When the environmental cell is placed in an evacuated volume, the pressure in the environmental cell is a governed by the conductance of the aperture 15 and the inflow of gas via hose nipple 16. The diameter of the aperture 15 is typically between 0.1 and 1 mm, balancing the demands for a small hole to limit the amount of gas flowing from the cell to the evacuated area of the particle-optical apparatus and the demand for a large hole so as to make a large area of the sample available to the primary beam of particles, without said primary beam being intercepted by foil 14. By regulating the amount of gas admitted to the environmental cell via hose nipple 16, e.g. by using a leak valve, the pressure within the environmental cell can be regulated. Another way of regulating the pressure is by connecting the hose nipple to a volume with a much reduced pressure of the particle-optical apparatus, e.g. to a pre-vacuum pump or a dedicated volume with a pressure of e.g. between 10 and 100 mbar.

It is remarked that the gas conductance of the hose between the hose nipple 16 and the before mentioned leak valve, pre-vacuum pump or volume with reduced pressure may also be used to limit said gas flow into the environmental cell.

It is noted that the area of the sample that can be irradiated by the primary beam is limited by the diameter of the central hole. By placing a small x-y table inside the vacuum enclosure, said table capable of moving the sample with respect to the base, different parts of the sample can be irradiated. Another way is to make the cylindrical body 11 movable with respect to the base (while keeping the vacuum integrity between base and cylindrical body intact) and displacing the two parts with an external displacement mechanism.

Figure 3A:
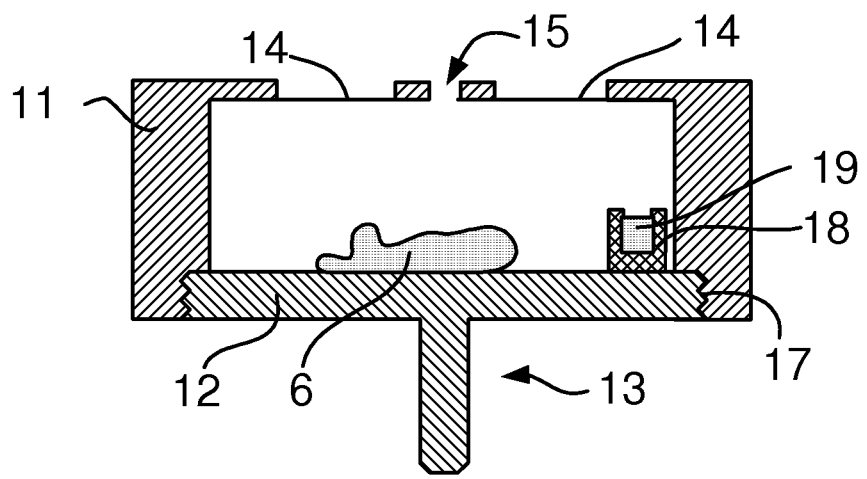
FIGS. 3A and 3B schematically show another embodiment of the environmental cell according to the invention.
Figure 3B:
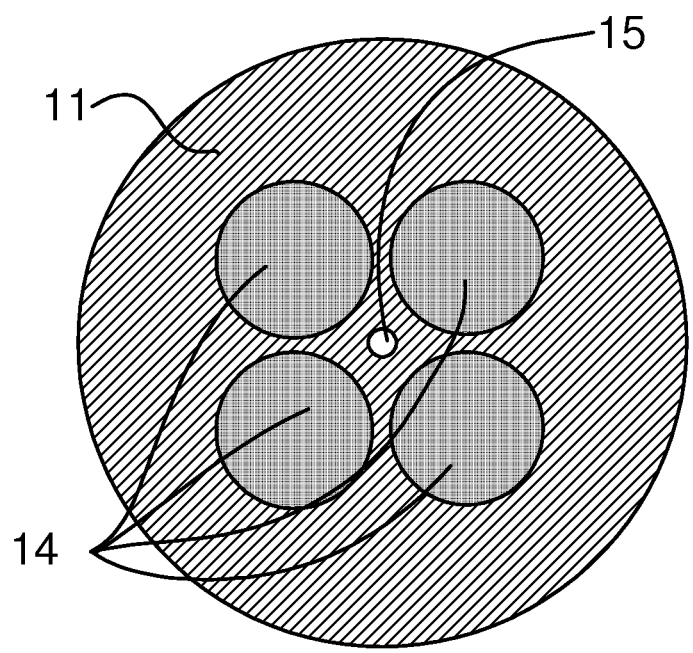

FIGS. 3A and 3B schematically show another embodiment of the environmental cell according to the invention.

FIG. 3A shows a sectional view of the environmental cell, while FIG. 3B shows a top view, that is: a view of the side of the environmental cell intended to face the column.

FIG. 3A can be thought to be derived from FIG. 2A, and FIG. 3B can be thought to be derived from FIG. 2B. Instead of one foil 14, the area of the vacuum enclosure transparent to radiation is formed by four circular areas 14 surrounding the central hole 15. Central hole 15 is now formed in a non-transparent part of the cylindrical body 11, e.g. a metallic part.

Instead of hose nipple 16 a small crucible 18 filled with material 19 is used to admit gas to the environmental cell. Material 19 can be a hygroscopic material, which by outgassing provides water vapour, or it can be another material outgassing at a convenient rate. The outgassing rate, and therefore the equilibrium pressure in the environmental cell, may be regulated by e.g. warming the crucible, either by heating the crucible alone or by warming the environmental cell as a whole.

Figure 4:
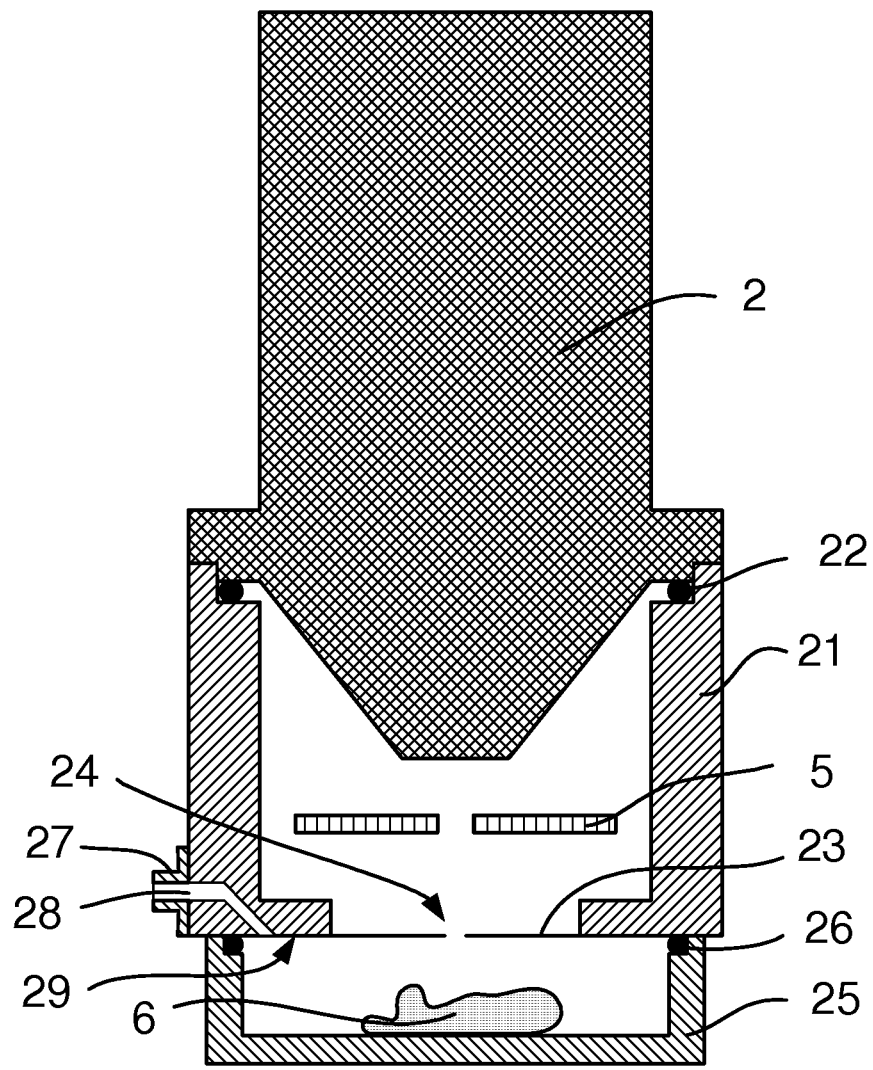
FIG. 4 schematically shows a table-top SEM with an environmental cell according to the invention.

FIG. 4 schematically shows a table-top SEM with an environmental cell according to the invention.

The figure shows a column 2 producing a beam of particles 4. The column seals on e.g. a cylindrical vacuum chamber 21 with a seal in the form of an O-ring 22. The vacuum chamber is evacuated with a vacuum pump (not shown) connected to the vacuum chamber. The side of the vacuum chamber opposite to the side where the column seals on the vacuum chamber shows a flat surface 29 against which a cup 25 seals with an O-ring 26. The flat surface of the vacuum chamber shows a large hole that is covered with a foil 24 so that the foil is positioned between the vacuum chamber and the cup. The foil is transparent to secondary radiation. The foil shows an aperture 25 through which the beam of particles 4 passes to irradiate the sample 6. Between the foil and the column a detector for radiation 5 is mounted to detect the radiation emerging from the sample in response to the beam of particles impinging on the sample. The radiation to which the detector is sensitive may comprise secondary electrons, back-scattered electrons and X-rays. The cup is pumped down via the aperture 24. As the bottom of the cup is exposed to air, the cup is pressed against the flat surface of the vacuum chamber. A channel 28 between a hose nipple 27 on the outside of the vacuum chamber and the flat surface provides a gas-inlet to the inside of the cup 25. The hose nipple may connect to a gas reservoir with an appropriate pressure so as to maintain a desired equilibrium pressure at the inside of cup 25.

By sliding the cup 25 over the flat surface 29 the position of the sample with respect to the column 2 and the aperture 24 is changed. Thereby different parts of the sample can be selected to be irradiated by the beam of particles 4.

It is noted that channel 28, or another channel like that, can be used to pre-evacuate the cup 25 to avoid excessive pressure differences over the foil 23, which may result in a rupture of said foil.

It is further noted that in this embodiment the environmental cell is formed by the cup and the vacuum chamber, the vacuum chamber being a non-exchangeable part of the particle-optical apparatus.

It is remarked that the transparent foil may be detachable, so that for certain applications of the apparatus the foil may be inserted and for other applications may be removed.

It is also remarked that the foil may be on ground potential, but may also be kept at a high voltage so as to accelerate the secondary electrons, thereby increasing the energy of the secondary electrons when they arrive at the foil. As known to the skilled person such a foil shows a higher transparency to electrons with a higher energy than for electrons with a low energy.

Figure 5:
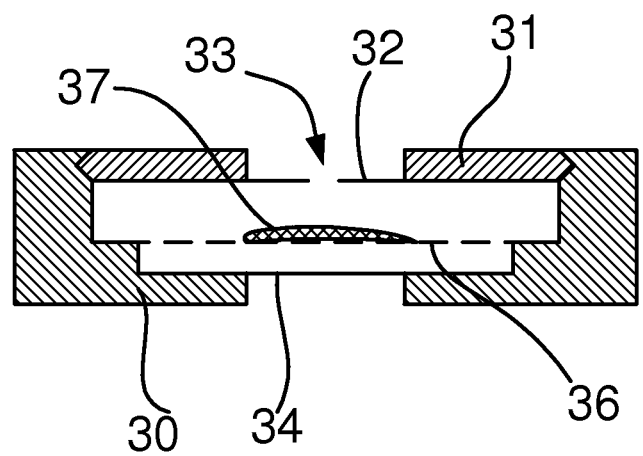
FIG. 5 schematically shows an embodiment of the environmental cell according to the invention for use with thin samples.

FIG. 5 schematically shows an embodiment of the environmental cell according to the invention for use with thin samples.

FIG. 5 shows a cylindrical body 30 on which a plate 31 is clipped. The plate shows a rim around part of its circumference which joins with a lip surrounding the cylindrical body so that the two parts can be joined easily.

It is noted that other ways of fastening the two parts can be used, such as the use of a screw thread as shown before. The fastening is preferably done in such a way that the parts 30 and 31 can be re-used, but also ways of fastening may be used where one or both parts are 'disposables'.

Plate 31 comprises a foil 32 transparent to radiation. Said foil shows an aperture 33 for passing a beam of particles. The cylindrical body 30 also comprises a foil transparent to radiation, foil 34. A thin sample 37 is mounted on a grid 36. 'Thin' is here defined as sufficiently thin for radiation to emerge from both sides of the sample. As the sample is placed between the two foils 32 and 34 radiation can be collected from a large solid angle by the use of two detectors, one placed at the side of foil 32 and one at the side of foil 34.

To insert the sample in the environmental cell the plate 31 is first removed from the cylindrical body. The grid, with the sample mounted on it, is then inserted in the cylindrical body and the plate 31 is clipped on the cylindrical body.

Preferably the grid 36 is a conventional TEM grid, thereby enabling the preparation of the sample in conventional manner and e.g. a subsequent inspection of the sample without environmental cell in a conventional TEM.

It is noted that foil 34 may be a continuous foil. For certain applications, such as application where a diffractogram must be obtained, the foil may show a central aperture to pass the beam of particles.

It is also noted that the parts of the environmental cell can be joined in a variety of ways, including screwing together, holding them together with a separate clip, or by forming one of the parts such that it e.g. clips onto the other. The vacuum seal between the parts of the vacuum enclosure need not be very tight, as the vacuum enclosure shows a hole anyway for passing the beam of particles, giving a minimum leak rate.

It is remarked that the radiation detected by each of the two detectors need not be identical, and thus that the composition of the foils may be chosen differently as well. By forming foil 32 from a material transparent to electrons and foil 34 from a material transparent to X-rays, it is possible to detect secondary electrons at one side of the environmental cell and X-rays on the other side. This may be beneficial when the foil 34 can e.g. be chosen sturdy enough to carry the sample directly, so that there is no need to mount the sample a grid, but the sample is deposited on the foil itself. Forming the foils from different materials may also result in a better price/performance.

Figure 6:
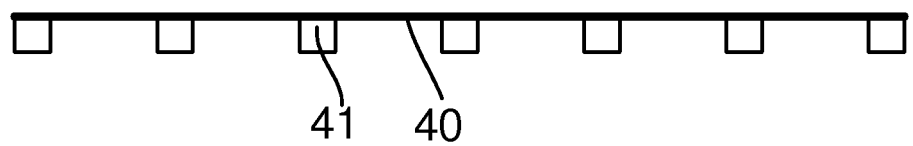
FIG. 6 schematically shows a foil transparent to radiation strengthened by a grid.

FIG. 6 schematically shows a foil transparent to radiation strengthened by a grid.

In FIG. 6 a fragile foil 40, said foil transparent to radiation, is mounted on and supported by a more sturdy support (or carrier) 41, said support e.g. formed as a grid. The grid can be a metal grid, such as a conventional copper TEM grid, but may also be made of e.g. a synthetic material such as Nylon®. It is also possible to form the foil and the support in a lithographic process, the foil formed from a thin layer of e.g. $SiO_2$ or $Si_3N_4$ and the support from a thicker layer of e.g. Si. 'Thin' is here defined in sufficiently thin to show transparency for the radiation to be detected by the detector of the particle-optical apparatus in which the environmental cell is used.

It is noted that a thin layer of a conductive material, such as carbon, can be deposited on a non-conductive foil or support material to avoid charging of the foil and/or support.

I claim:

1. A method for forming an image of a sample with a particle-optical apparatus, the method comprising:
    providing a particle-optical apparatus comprising a particle-optical column, said column equipped to produce a beam of particles along a particle-optical axis,
    providing an environmental cell having an aperture facing the column, the aperture surrounding the particle-optical axis through which the primary beam passes without passing through a solid material, said environmental cell equipped to be exposed to vacuum, said environmental cell showing an inner volume wherein a sample may be placed, said environmental cell equipped to withstand a pressure difference over the aperture, the material of the environmental cell substantially impervious to fluids,
    providing a sample in said environmental cell,
    providing a detector for the detection of secondary radiation emanating from the sample as a result of the beam of particles impinging on the sample,
    evacuating the area between the aperture and the particle-optical column,
    directing the beam of particles through the aperture to the sample, and
    detecting secondary radiation other than visible light emanating from the sample in response to the irradiation of the sample with the beam of particles,
    in which at least part of the material of the environmental cell is transparent to the secondary radiation other than visible light, and
    the detector is positioned outside the environmental cell, the detector arranged to detect the secondary radiation other than visible light passing through the part of the environmental cell transparent to the secondary radiation.

2. The method of claim 1 in which the part of the environmental cell transparent to the secondary radiation faces the column.

3. The method of claim 1 in which the secondary radiation comprises electrons and/or X-rays and at least part of the material of the environmental cell is transparent to said electrons and/or X-rays and the detector is equipped to detect said electrons and/or X-rays.

4. The method of claim 1 in which the beam of particles is a focused beam of particles that is scanned over the sample.

5. The method of claim 1 in which the material of the environmental cell transparent to the secondary radiation other than visible light comprises a foil strengthened with a carrier, said foil transparent to the secondary radiation.

6. The method of claim 1 in which the environmental cell comprises a second aperture arranged round the particle-optical axis at the side of the environmental cell opposite to the column, as a result of which particles produced by the column can subsequently pass through the aperture facing the particle-optical column, the sample and the second aperture.

7. The method of claim 1, in which the material of the environmental cell transparent to the secondary radiation other than visible light comprises material from the group of polyamide, polymide, polyamide-imide, polyethylene, polypyrrole, collodion, PARLODION® collodion, KAPTON® flexible film, FORMVAR® synthetic resinous plastic material, VINYLEC® polyvinyl resin, BUTVAR® synthetic resinous plastic material, PIOLOFORM® polyvinyl alcohol formaldehyde acetyl, $SiO_2$, SiO, SiN and C.

8. The method of claim 1 in which the material of the environmental cell transparent to the secondary radiation other than visible light shows a transparency of at least 50% for electrons.

9. The method according to claim 1 in which, while directing the beam of particles to the sample, a gas is admitted to the environmental cell.

10. The method according to claim 9 in which the gas causes, when irradiated by a beam of electrons or ions, enhanced etching of the sample or deposition of material onto the sample.

11. The method according to claim 9 in which the gas comprises helium.

12. An environmental cell for use in a particle-optical apparatus, said particle-optical apparatus having
    a particle-optical column for producing a beam of particles along a particle-optical axis, a sample position on which a sample may be positioned, and a detector for detecting secondary radiation, said secondary radiation emanating from the sample as a result of the irradiation of the sample with the beam of particles;

the environmental cell comprising:

a vacuum enclosure having an aperture for passing the beam of particles, the aperture passing the beam of particles without the particles passing through a solid material, the material of the vacuum enclosure impervious to fluid and equipped to withstand a pressure difference, in which at least a part of the material of the vacuum enclosure is transparent to secondary radiation other than light.

13. The environmental cell of claim 12 in which the part of the vacuum enclosure transparent to secondary radiation other than light is transparent to electrons and/or X-rays.

14. The environmental cell of claim 13 in which the part of the vacuum enclosure transparent to the secondary radiation shows a transparency of at least 50% for electrons.

15. The environmental cell claim 12 in which the environmental cell is equipped with means to admit gas to the environmental cell.

16. The environmental cell of claim 12 in which the environmental cell forms the specimen chamber of a SEM, at least part of the outside of the environmental cell equipped to be exposed to vacuum while another outside part of the environmental cell is exposed to atmospheric pressure.

17. The environmental cell of claim 12 in which the part of the vacuum enclosure transparent to the secondary radiation other than light comprises material from the group of polyamide, polymide, polyamide-imide, polyethylene, polypyrrole, collodion, PARLODION® collodion, KAPTON® flexible film, FORMVAR® synthetic resinous plastic material, VINYLEC® polyvinyl resin, BUTVAR® synthetic resinous plastic material, PIOLOFORM® polyvinyl alcohol formaldehyde acetyl, $SiO_2$, SiO, SiN and C.

18. The environmental cell of claim 12 in which the part of the vacuum enclosure transparent to the secondary radiation other than light comprises a foil transparent to the secondary radiation other than light, said foil supported by a carrier.

19. The environmental cell of claim 12 in which the cell further comprises a second aperture arranged such that particles passing through the other aperture and through the sample pass through the second aperture.

20. The environmental cell of claim 12 in which the cell further comprises means for positioning the sample, as a result of which different parts of the sample may be irradiated by the particle-optical column.

21. A particle-optical apparatus, comprising:

a particle-optical column for producing a beam of particles along a particle-optical axis;

a sample position on which a sample may be positioned;

a detector for detecting secondary radiation, said secondary radiation emanating from the sample as a result of the irradiation of the sample with the beam of particles, and an environmental cell according to claim 12.

22. The particle-optical apparatus of claim 21, in which the particle-optical apparatus comprises a scanning electron microscope, a transmission electron microscope or a focused ion beam.

23. A method of forming an image of a sample with a particle-optical apparatus, the method comprising;

directing a charged particle beam toward a sample in a cell within a particle-optical apparatus, the charged particle beam passing through an aperture formed in the cell wall, the aperture passing the beam of particles without the particles passing through a solid material, the pressure in the charged particle-optical apparatus outside the cell being lower than the pressure in the cell, wherein portions of a cell wall are composed of material that is transparent to secondary radiation;

detecting secondary radiation other than visible light using a detector positioned outside of the cell, the secondary radiation passing through one or more of the transparent portions of the cell wall.

24. The method of claim 23 in which directing a charged particle beam toward a sample in a cell within a particle optical apparatus includes directing an electron beam or an ion beam.

25. The method of claim 23 in which detecting secondary radiation other than visible light using a detector positioned outside of the cell includes detecting backscattered electrons.

26. The method of claim 23 in which detecting secondary radiation other than visible light using a detector positioned outside of the cell includes detecting x-rays.

27. The method of claim 23 detecting secondary radiation other than visible light using a detector positioned outside of the cell, the secondary radiation passing through one or more of the transparent portions of the cell wall includes detecting secondary radiation through a material from the group consisting of polyamide, polymide, polyamide-imide, polyethylene, polypyrrole, collodion, PARLODION® collodion, KAPTON® flexible film, FORMVAR® synthetic resinous plastic material, VINYLEC® polyvinyl resin, BUTVAR® synthetic resinous plastic material, PIOLOFORM® polyvinyl alcohol formaldehyde acetyl, $SiO_2$, SiO, SiN and C.

* * * * *